United States Patent [19]

Izumi et al.

[11] Patent Number: 5,070,258

[45] Date of Patent: Dec. 3, 1991

[54] INTEGRATED CIRCUIT HAVING METAL SUBSTRATE USED TO PROVIDE ELECTRICAL INDICATION OF OPERATION MODE OF CIRCUITS

[75] Inventors: Tomoji Izumi, Hatsukaichi; Nagahisa Fujita; Yuichi Ito, both of Hiroshima, all of Japan

[73] Assignee: Mazda Motor Corporation, Hiroshima, Japan

[21] Appl. No.: 578,232

[22] Filed: Sep. 6, 1990

[30] Foreign Application Priority Data

Sep. 7, 1989 [JP] Japan .................................. 1-230312

[51] Int. Cl.⁵ ........................ H03K 3/26; H03R 23/68
[52] U.S. Cl. ................................ 307/303; 307/303.1; 361/413; 361/395
[58] Field of Search ............................ 307/303, 303.1; 439/874, 188, 189; 340/687; 357/40, 80, 84; 361/395, 388, 412, 413

[56] References Cited

U.S. PATENT DOCUMENTS 3,946,428  3/1976  Anazawa et al. ................. 357/74
4,507,697  3/1985  Ozil et al. ........................ 340/687
4,755,902  7/1988  Takahashi ........................ 361/413
4,918,335  4/1990  Chall, Jr. ....................... 307/303.1
5,016,086  5/1991  Inoue et al. ..................... 361/395

Primary Examiner—Stanley D. Miller
Assistant Examiner—Richard Roseen

[57] ABSTRACT

An integrated circuit disclosed in this application includes a circuit board in which a conductive layer having a desired pattern is formed on a metal substrate through an insulating layer, and a circuit element group mounted on the insulating layer and connected to the predetermined conductive layer. A judgment circuit for discriminating on the basis of a potential of the metal substrate which one of at least two different logic processing modes is set is formed on the insulating layer. The circuit element group includes a circuit element including a logic processing unit having at least two different logic processing contents. The circuit element selectively switches and executes a logic processing operation corresponding to the logic processing mode discriminated by the judgment circuit from the at least two different logic processing contents.

9 Claims, 11 Drawing Sheets

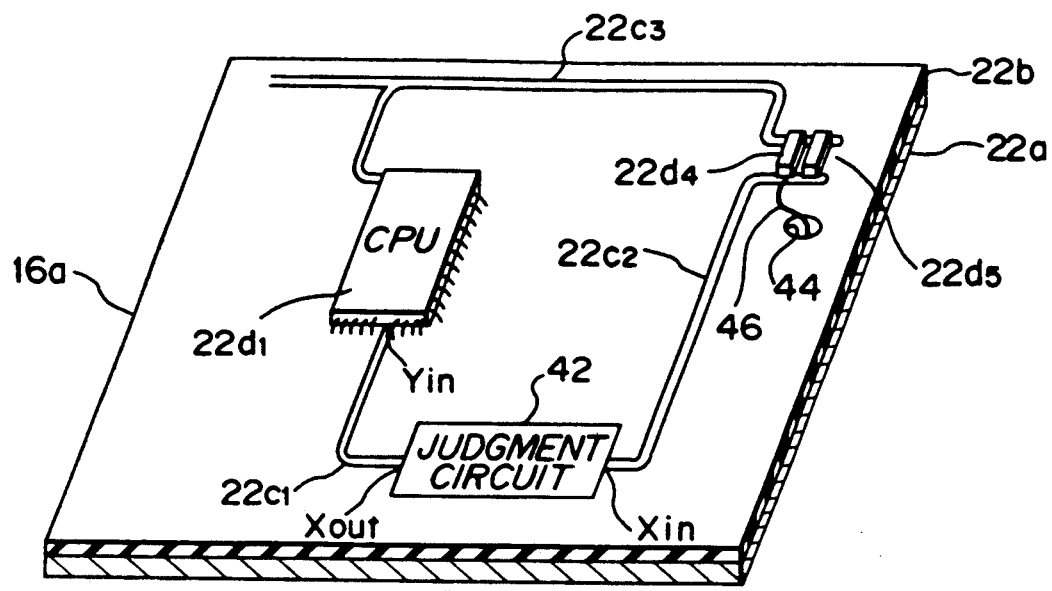
F I G. 10
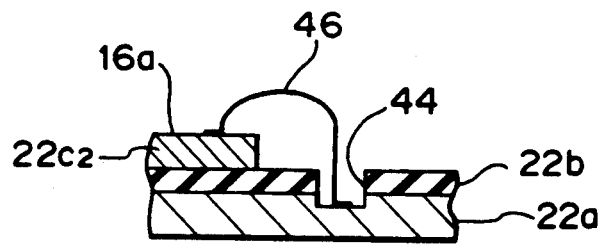
F I G. 11
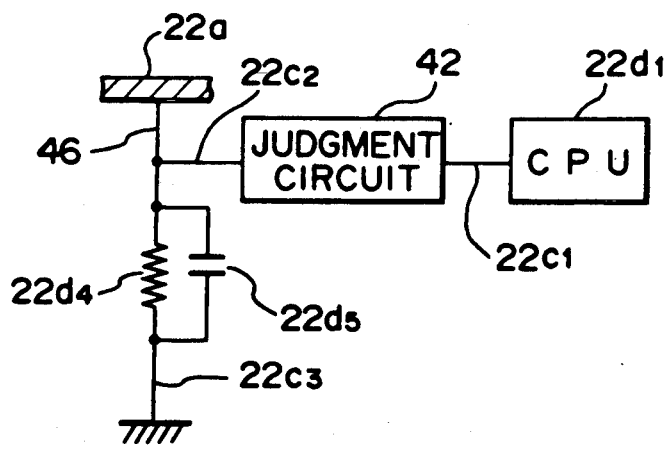
F I G. 12

MEMORY

| ADDRESS | DATA |
|---|---|
| ADR + 0 | 1 / 0 |
| ADR + 1 | 1 / 0 |
| ADR + 2 | 1 / 0 |
| ⋮ | ⋮ |

F I G. 15

INTEGRATED CIRCUIT HAVING METAL SUBSTRATE USED TO PROVIDE ELECTRICAL INDICATION OF OPERATION MODE OF CIRCUITS

BACKGROUND OF THE INVENTION

The present invention relates to an integrated circuit comprising a circuit board in which a conductive layer having a desired pattern is formed on a metal substrate through an insulating layer, and a circuit element nondetachably mounted on the insulating layer and having a nonvolatile storage content which can be rewritten by an external operation.

Conventionally, a technique disclosed in Japanese Patent Publication No. 46-13234 is known as an integrated circuit having a pair of metal substrates, wherein conductive layers are adhered to the metal substrates through insulating layers, a circuit element is fixed to each conductive layer, and the conductive layers are connected through a connecting substrate, and are separated from each other to face each other. A method of manufacturing the integrated circuit disclosed in this prior art comprises the step of anode-oxidizing at least one major surface of an aluminum substrate to form a thin aluminum oxide layer on the substrate surface, the step of selectively bonding and forming a resistive material and a high-conductivity material on the thin aluminum oxide film to form a plurality of circuit elements, the step of fixing transistor pellets on lead portions formed by selectively bonding the high-conductivity material, and the step of sealing at least all the circuit elements with an insulating resin.

In the integrated circuit formed in this manner, on a circuit board in which a conductive layer of a desired pattern is formed on a metal substrate through an insulating layer, at least one memory element is nondetachably mounted as a so-called bare chip on the insulating layer.

The integrated circuit formed in this manner can quickly and effectively dissipate heat generated from resistors or transistors during an operation, thus realizing an integrated circuit of, e.g., an output circuit.

The integrated circuit formed in this manner may be employed in a vehicle in view of its compact structure and low cost. However, when the integrated circuit having a metal substrate is actually used in a vehicle, a circuit element comprising a logic processing unit mounted on the integrated circuit, i.e., a CPU has been developed. The CPU has a first logic processing content as a function of a predetermined engine control unit in an engine drive state, and a second processing content as a diagnostic function in a maintenance state, which can be selectively used.

In order to selectively execute one of at least two different logic processing contents of the logic processing unit, a special-purpose switching terminal for switching these functions must be equipped, and must be arranged outside the integrated circuit. This structure may pose a problem of a complicated structure.

SUMMARY OF THE INVENTION

The present invention has been made in consideration of the above situation, and has as its principal object to provide an integrated circuit having a metal substrate, which can selectively switch and execute at least two different logic processing contents without complicating an arrangement.

It is another object of the present invention to provide an integrated circuit which can switch logic processing contents executed therein without disassembling the integrated circuit.

In order to achieve the above objects, according to the present invention, there is provided an integrated circuit having a metal substrate, comprising: a circuit board in which a conductive layer having a desired pattern is formed on a metal substrate through an insulating layer; a circuit element mounted on the insulating layer, connected to the predetermined conductive layer, and comprising a logic processing unit having at least two different logic processing contents; and judgment means, formed on the insulating layer, for discriminating on the basis of a potential of the metal substrate which one of at least two different logic processing modes is set, wherein the circuit element selectively switches and executes a logic processing operation corresponding to the logic processing mode discriminated by the judgment means from the at least two different logic processing contents.

In the integrated circuit having the metal substrate with the above arrangement, in a state wherein a circuit element comprises a logic processing unit having at least two different logic processing contents, at least two different logic processing modes are discriminated on the basis of a potential of the metal substrate, and the circuit element selectively switches and executes a logic processing operation corresponding to the discriminated logic processing mode from the at least two different logic processing contents.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 10 is a schematic perspective view showing an arrangement of a switching mechanism on the first circuit board shown in FIG. 9;

FIG. 11 is a sectional view showing a connecting state between an input line and a circuit board body through a bonding wire;

FIG. 12 is a circuit diagram showing electrical connections of the switching mechanism;

FIG. 15 shows a map indicating address positions on a memory.

DETAILED DESCRIPTION OF THE PREFERRED EMBODIMENT

An embodiment of an integrated circuit having a metal substrate according to the present invention will be described in detail below with reference to FIGS. 1 to 15. In this case, the present invention is applied to a case-like hybrid integrated circuit.

Figure 1:
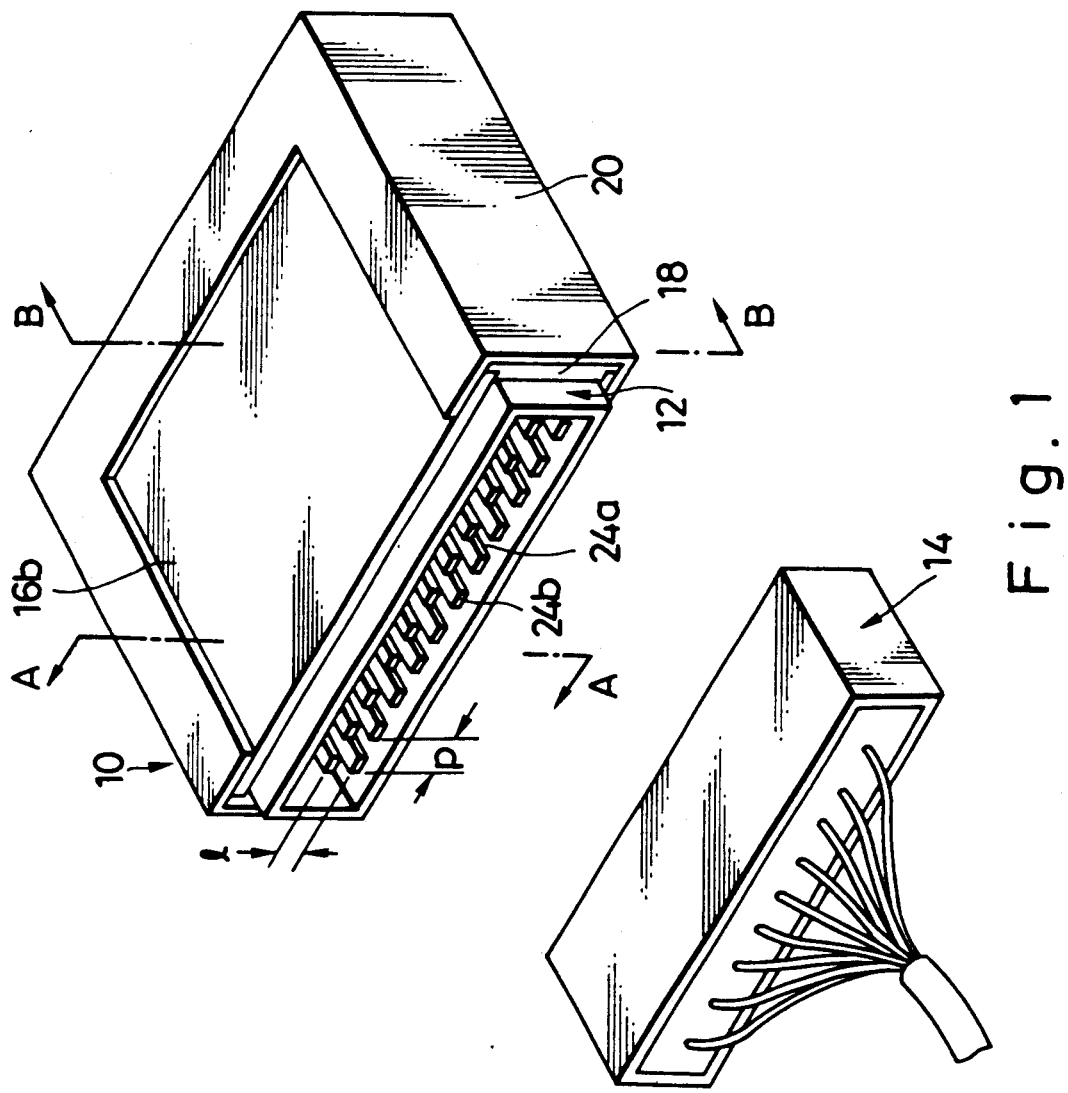
FIG. 1 is a perspective view showing an embodiment of an integrated circuit having a metal substrate according to the present invention.

FIG. 1 shows a hybrid integrated circuit 10 of this embodiment. The hybrid integrated circuit 10 is arranged as a control unit as an independent vehicle function component. More specifically, the integrated circuit 10 is arranged as a hybrid integrated circuit which has a function of an engine control unit as a first logic processing content and a diagnostic function as a second logic processing content, and selectively switches and executes these two processing contents.

As shown in FIG. 1, the hybrid integrated circuit 10 is formed as a box-like case, whose interior is closed. A male connector 12 as a connecting device is integrally formed on one end (rear end) of the integrated circuit 10. The male connector 12 is connected to a conventional female connector 14, as will be described in detail later.

Figure 2:
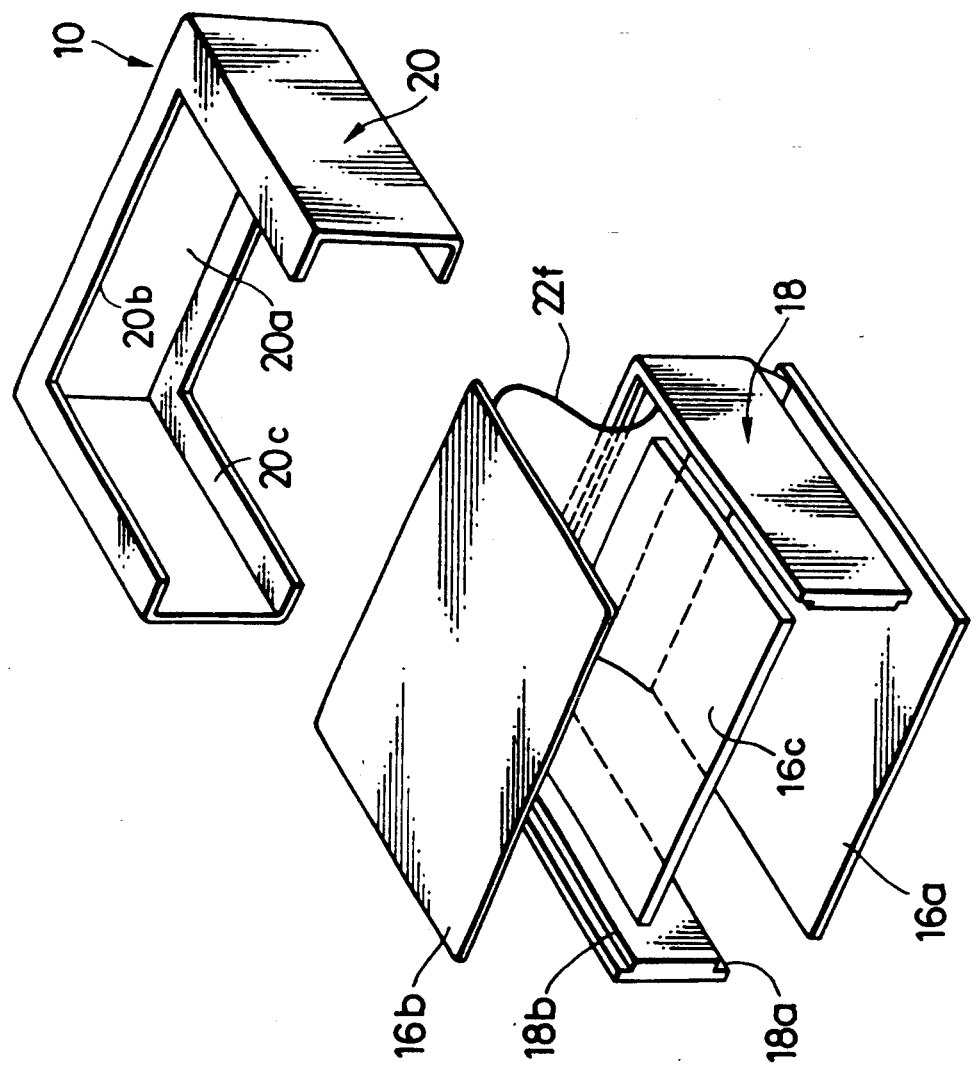
FIG. 2 is an exploded perspective view showing an arrangement of the integrated circuit shown in FIG. 1.
Figure 3A:
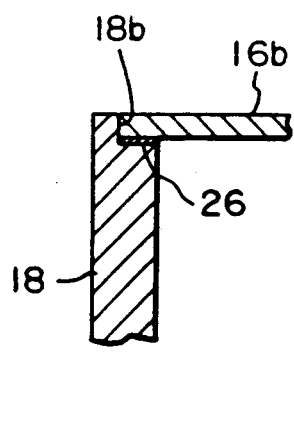
FIG. 3A is a sectional view taken along a line A—A in FIG. 1.
Figure 3B:
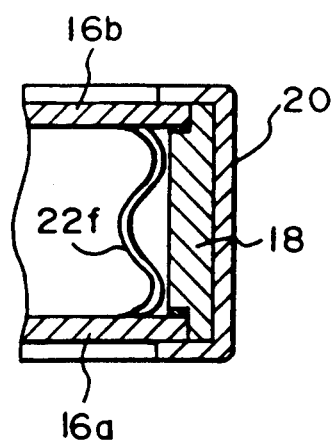
FIG. 3B is a sectional view taken along a line B—B in FIG. 1.

As shown in FIGS. 2 to 3B, the hybrid integrated circuit 10 comprises a pair of first and second circuit boards 16a and 16b which are vertically separated from each other, a side plate 18 for separating the first and second circuit boards 16a and 16b at a predetermined distance and closing the side surfaces, and a frame 20 for integrally fixing the first and second circuit boards 16a and 16b and the side plate 18.

Circuit elements such as an IC chip serving as a CPU which has both a function of an engine control unit and a diagnostic function, and selectively switches and executes one of these functions, an IC chip serving as a memory element, resistors, capacitors, and the like are mounted on the first and second circuit boards 16a and 16b. More specifically, so-called logic circuit elements are connected to the lower first circuit board 16a, and so-called power circuit elements are connected to the upper second circuit board 16b. Note that the above-mentioned IC chips are directly mounted (fixed) on the insulating layer 22b as bare chips, as will be described later.

Figure 4A:
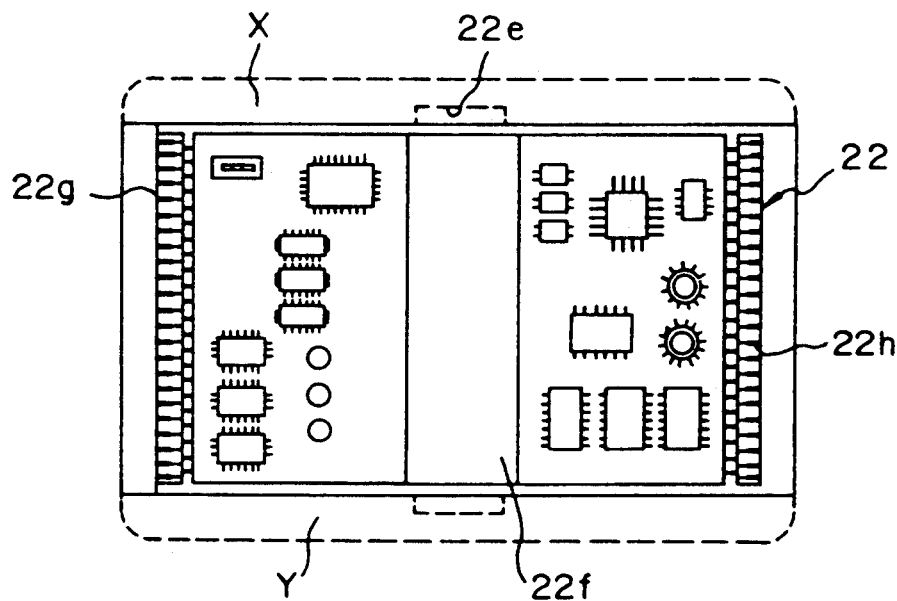
FIG. 4A is a plan view showing an arrangement of a common circuit board.
Figure 4B:
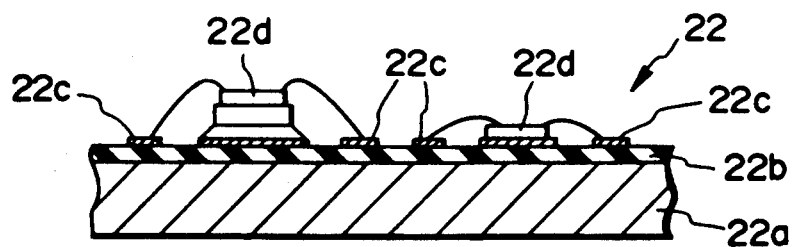
FIG. 4B is a sectional view showing the arrangement of the common circuit board.

As shown in FIG. 4A, the first and second circuit board 16a and 16b are formed by splitting a single common circuit board 22. More specifically, as shown in FIG. 4B, the common circuit board 22 is formed by a circuit board body 22a formed of a conductive material such as aluminum and serving as a metal substrate, an insulating layer 22b adhered on the entire upper surface of the circuit board body 22a, conductive layers 22c formed on the insulating layer 22b to have a predetermined circuit pattern and to define a circuit network, and circuit elements 22d fixed on and electrically connected to the conductive layers 22c.

A vertically extending opening portion 22e is performed at the central portion of the common circuit board 22, as shown in FIG. 4A. The circuit networks on the left and right portions of the opening portion 22e are connected to each other through a flexible circuit board 22f arranged over the opening portion 22e. By cutting off upper and lower edges (regions indicated by reference symbols X and Y) including the upper and lower ends of the opening portion 22e, the pair of circuit boards 16a and 16b are formed while being connected through the flexible circuit board 22f.

In the common circuit board 22, a plurality of connecting terminals 22g and 22h are formed in lines along edges on the upper surfaces of portions corresponding to outer edge portions of the circuit boards 16a and 16b, i.e., on the opposing inner surfaces of the edge portions defining one end of the case in a state wherein the opposing circuit boards 16a and 16b are vertically separated from each other. Connecting pins 24a and 24b of the male connector 12 (to be described later) are fixed and electrically connected to these connecting terminals 22g and 22h to project outwardly.

As shown in FIG. 2, the side plate 18 described above is formed to have a U-shaped shape having one open side when viewed from the above. The open side portion serves as one end of the case. Stepped portions 18a and 18b for receiving three edge portions of each of the circuit boards 16a and 16b are formed at inner side edges of the upper and lower end faces of the side plate 18.

As shown in FIG. 3A, the circuit boards 16a and 16b are fitted in the corresponding stepped portions 18a and 18b through seal rubber members 26. Since the seal rubber members 26 are inserted, dust or the like can be prevented from entering the case from gaps between the circuit boards and the stepped portions.

The frame 20 is formed of a synthetic resin as an insulating member. The frame 20 is formed to surround the side surfaces closed by the side plate 18 while vertically clamping it, as shown in FIG. 2. More specifically, the frame 20 consists of an integral body of a main body 20a opposing the side plate 18, and flange portions 20b and 20c extending inwardly from the upper and lower ends of the main body 20a by a predetermined distance (more specifically, by a distance large enough to clamp three non-open edge portions of the circuit boards 16a and 16b).

As shown in FIG. 3B, the frame 20 vertically clamps the upper and lower second and first circuit boards 16b and 16a respectively fitted in the upper and lower stepped portions 18b and 18a of the side plate 18, thereby integrally constituting the case. As shown in FIG. 3B, the flexible circuit board 22f for connecting circuit elements 22d of the upper and lower second and first circuit boards 16b and 16a is located slightly inwardly from the other end portion of the side plate 18.

Since the frame 20 is formed in this manner, the first and second circuit boards 16a and 16b can maintain an assembled state while being vertically separated at a predetermined distance in a state wherein the side plate 18 is interposed therebetween.

In this embodiment, the hybrid integrated circuit 10 is formed into a case-like shape, and the upper and lower surfaces of the case are directly defined by the circuit boards 16b and 16a. As a result, a compact, light-weight structure can be realized as compared to a case wherein the first and second circuit boards 16a and 16b are housed in a separate case.

The arrangement of the connecting device for connecting the case-like hybrid integrated circuit 10 with the above arrangement to portions to be controlled of the vehicle will be described below with reference to FIGS. 5 to 8.

Figure 5:
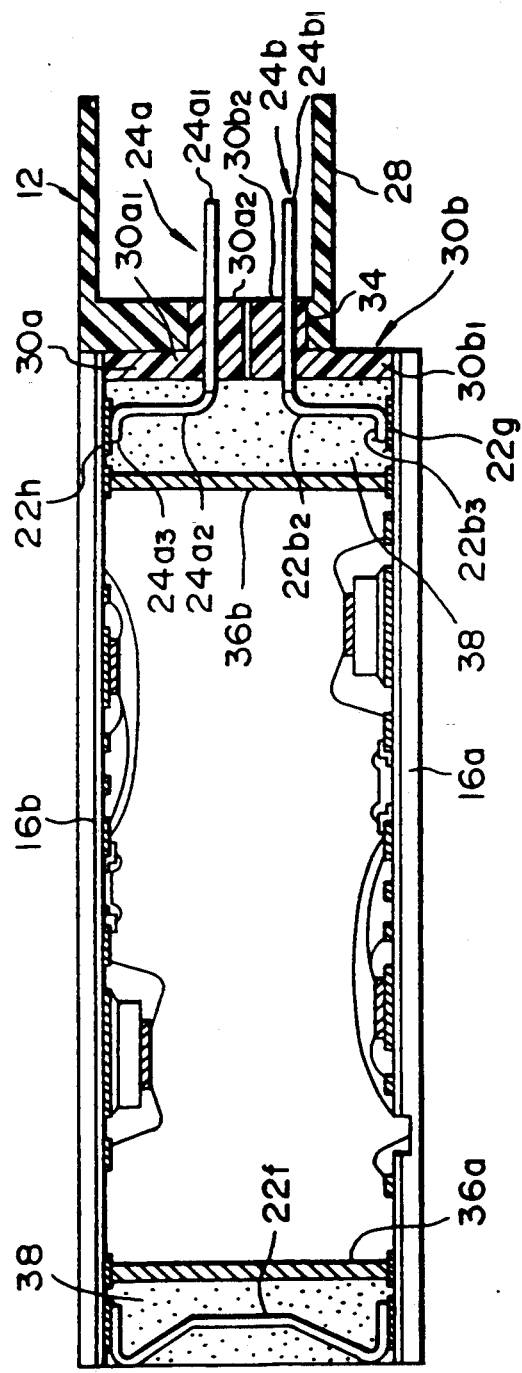
FIG. 5 is a sectional view showing an arrangement of a male connector mounted on the integrated circuit.

The connecting device comprises the male connector 12 mounted on one opening portion of the case-like hybrid integrated circuit 10 in a so-called internal mounting state, and the female connector 14 detachably connected to the male connector 12. As shown in FIG. 5, the male connector 12 has a so-called 3-piece structure, i.e., comprises a connector housing 28 formed into a box-like housing having open front and rear surfaces, an upper connecting pin support member 30a on which the upper connecting pins 24a are disposed to be laterally aligned in line, and a lower connecting pin support member 30b on which the lower connecting pins 24b are disposed to be laterally aligned in line.

The upper and lower connecting pin support members 30a and 30b are formed vertically symmetrically about the vertically central portion. The upper connecting pin support member 30a is integrally formed into a substantially L shape by an upright segment $30a_1$, and a projection $30a_2$ projecting outwardly from the lower end of the upright segment $30a_1$. The lower connecting pin support member 30b is integrally formed into a substantially inverted-L shape by an upright segment $30b_1$, and a projection $30b_2$ projecting outwardly from the upper end of the upright segment $30b_1$.

Each upper connecting pin 24a is integrally formed by a horizontal portion $24a_1$ which horizontally extends through the projection $30a_2$ to project in the back-and-forth direction, a vertical portion $24a_2$ which extends vertically upward from the inner edge of the horizontal portion $24a_1$ along the inner surface of the upright segment $30a_1$, and a bent portion $24a_3$ which is inwardly bent from the upper end of the vertical portion $24a_2$. The bent portion $24a_3$ is defined as a connecting portion connected to the corresponding connecting terminal 22h formed on the upper second circuit board 16b by soldering. The outward projecting portion of the horizontal portion $24a_1$ is defined as a connecting portion inserted in and connected to the female connector 14.

Each lower connecting pin 24b is integrally formed by a horizontal portion $24b_1$ which horizontally extends through the projection $30b_2$ to project in the back-and-forth direction, a vertical portion $24b_2$ which extends vertically downward from the inner edge of the horizontal portion $24b_1$ along the inner surface of the upright segment $30b_1$, and a bent portion $24b_3$ which is inwardly bent from the lower end of the vertical portion $24b_2$. The bent portion $24b_3$ is defined as a connecting portion connected to the corresponding connecting terminal 22g formed on the lower first circuit board 16a by soldering. The outward projecting portion of the horizontal portion $24b_1$ is defined as a connecting portion inserted in and connected to the female connector 14.

The connecting pin support members 30a and 30b have sizes large enough to be just fitted in the one-end opening portion of the case-like hybrid integrated circuit 10 in a state wherein they are coupled vertically. In other words, a range of the two upright segments $30a_1$ and $30b_1$ (i.e., an outer periphery) of the vertically coupled support members 30a and 30b just defines the inner periphery of the one-end portion of the hybrid integrated circuit 10.

Figure 6:
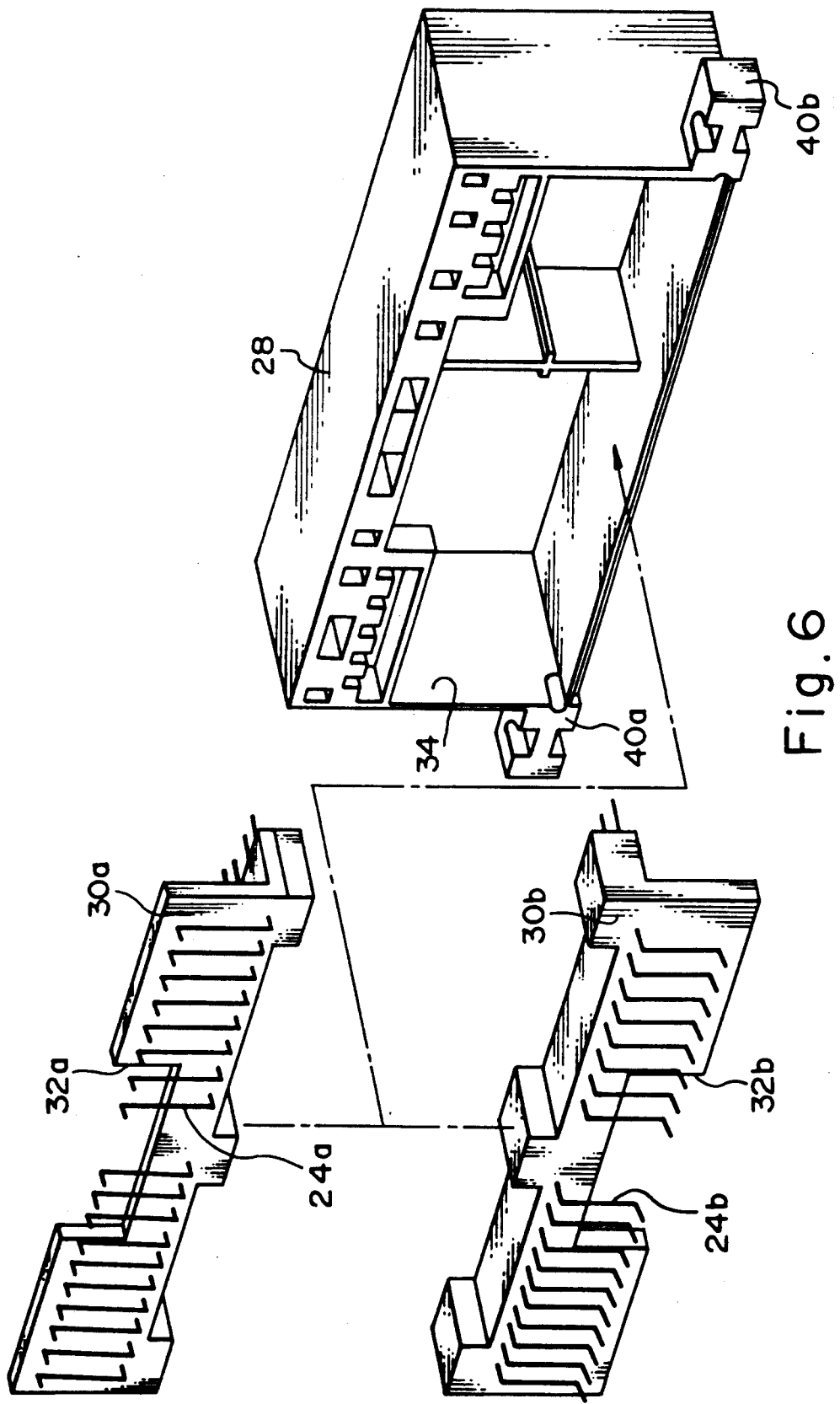
FIG. 6 is an exploded perspective view showing in detail the arrangement of the male connector.

Recesses 32a and 32b are respectively formed at the central portions of the upper and lower edges of the connecting pin support members 30a and 30b, as shown in FIG. 6. These recesses 32a and 32b define an injection hole of an epoxy resin which is injected after the male connector 12 is integrally assembled with the hybrid integrated circuit 10, as will be described later.

The upper and lower connecting pins 24a and 24b have vertically symmetrical shapes, i.e., have the same shape, and the upper and lower connecting pin support members 30a and 30b also have the vertically symmetrical shapes, i.e., the same shape. In this manner, since the connecting pin support members 30a and 30b on which the connecting pins 24a and 24b are mounted have the same shape, components can be commonly used, thus reducing cost.

Figure 7:
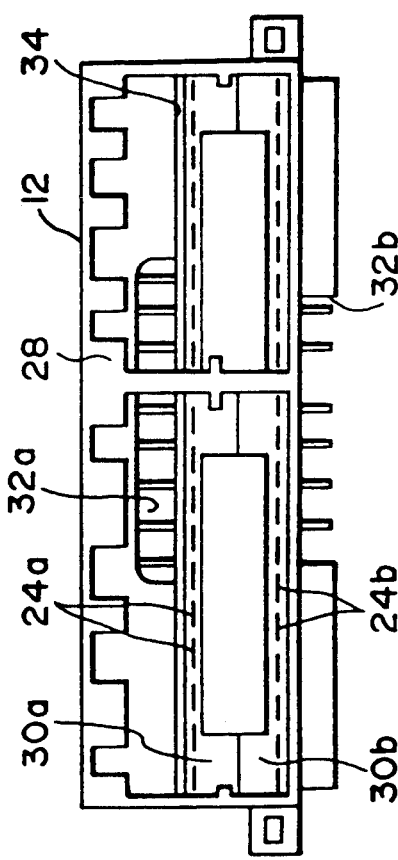
FIG. 7 is a front view showing an assembled state of the male connector.

The connector housing 28 described above has a fitting hole 34 which extends in the back-and-forth direction. The fitting hole 34 has a size large enough to receive the stacked projections $30a_2$ and $30b_2$ while the upper and lower connecting pin support members 30a and 30b are coupled, as shown in FIG. 7.

Mounting flanges 40a and 40b are formed integrally on two side portions of the connector housing 28. These flange portions 40a and 40b are fixed to a vehicle body (not shown) after the male connector 12 is mounted on and fixed to the hybrid integrated circuit 10. In this manner, a flange portion for mounting the hybrid integrated circuit 10 need not be provided to the hybrid integrated circuit 10 itself, resulting in the simple hybrid integrated circuit 10.

In this embodiment, a vertical interval l and a horizontal pitch p of the connecting pins 24a and 24b are defined on the basis of the conventional pin alignment specifications. As a result, the female connector 14 connected to the male connector 12 can employ a conventional one, thus providing economic advantages.

A conventional male connector is not employed since it is heavy and large in size. Instead, the special male connector 12 is formed in correspondence with the compact, light-weight case-like hybrid integrated circuit 10. Therefore, according to this embodiment, the compact, light-weight structure of the hybrid integrated circuit 10 can be assured.

Figure 8:
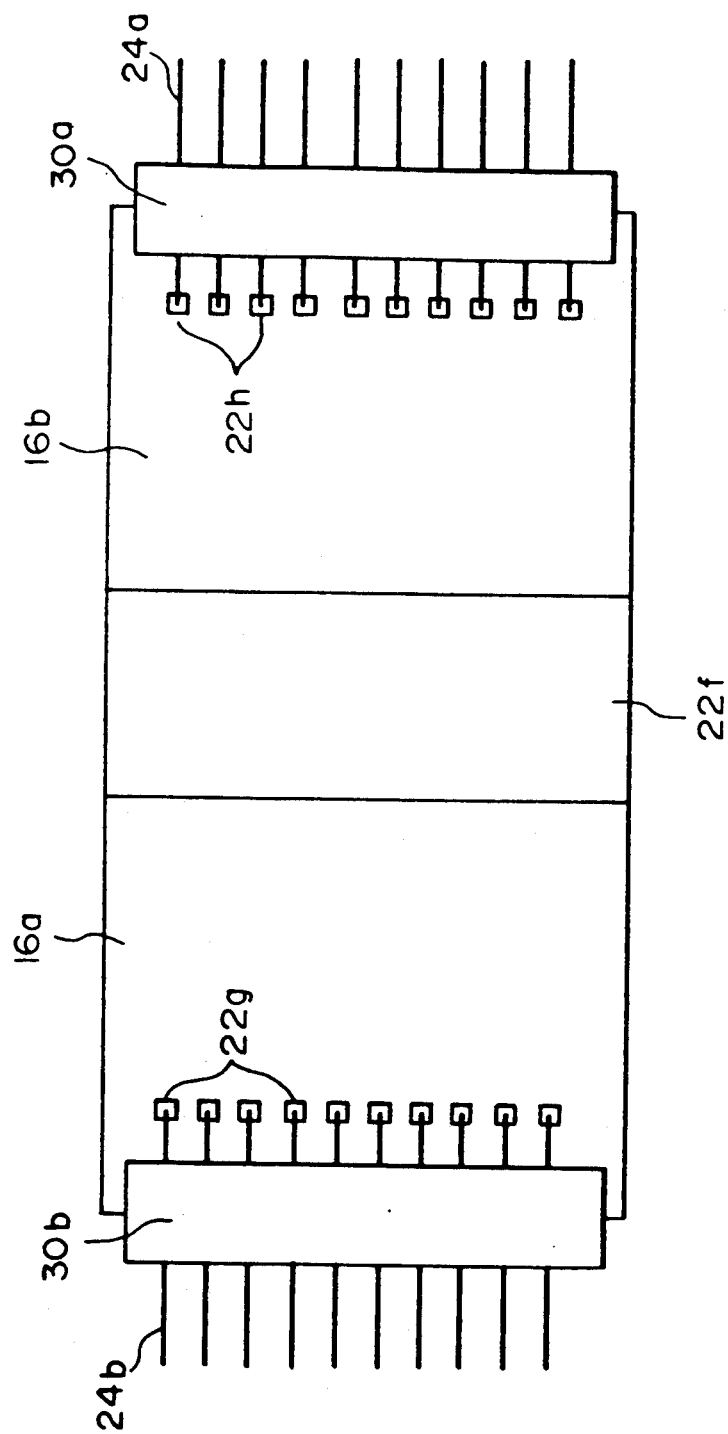
FIG. 8 is a plan view showing a state wherein connecting pin support members are fixed to a circuit board in an open state.

An assembly operation of the male connector 12 whose assembled state is shown in FIG. 5, and an assembly operation of the hybrid integrated circuit 10 will be described below with reference to FIG. 8.

As has been described above with reference to FIGS. 4A and 4B, the upper and lower edges X and Y are cut from the common circuit board 22 on which the predetermined circuit elements 22d are mounted, so that the first and second circuit boards 16a and 16b are formed in an open state on the same plane. As shown in FIG. 5, the corresponding pin support members 30a and 30b are fixed to the first and second circuit boards 16a and 16b in the open state by an adhesive.

As described above, the corresponding connecting pins 24a and 24b have already been mounted on these connecting pin support members 30a and 30b. In this manner, these connecting pins 24a and 24b are soldered to the corresponding connecting terminals 22g and 22h of the first and second circuit boards 16a and 16b in the open state. In particular, a precise soldering operation is required since the number of connecting terminals 22g and 22h is large. In this embodiment, however, since the first and second circuit boards 16a and 16b are set in the open state on the same plane, the soldering operation can be reliably executed, thus improving workability and assuring easy assembly.

Thereafter, the second circuit board 16b is lifted while the first circuit board 16a is held in position, and is moved to a position above and parallel to the lower first circuit board 16a. As shown in FIG. 8, the connecting pin support members 30a and 30b are then coupled vertically. When the connecting pin support members 30a and 30b are vertically coupled in this manner, the first and second circuit boards 16a and 16b are held to be parallel to each other.

Prior to the coupling operation, frame members 36a and 36b for keeping a predetermined interval between the first and second circuit boards 16a and 16b, and shielding an internal space from the outside while reinforcing the mechanical strength of the hybrid integrated circuit 10 are mounted in an upright state on the front and rear portions of the lower first circuit board 16a, as shown in FIG. 5. One frame member 36a is located slightly inwardly from the flexible circuit board 22f. The other frame member 36b is located slightly inwardly from the connecting terminals 22g and 22h.

The assembly is fitted in the fitting hole 34 of the connector housing 28 while maintaining the coupled state of the members 30a and 30b. In the fitting state, the male connector 12 is integrally mounted on the hybrid integrated circuit 10. Thereafter, as described above, the side plate 18 is attached to the hybrid integrated circuit 10, and the frame 20 is fitted thereon, thereby forming the hybrid integrated circuit 10 shown in FIG. 1, which integrally comprises the male connector 12.

After the assembly, an epoxy resin 38 is injected to a portion between the male connector 12 and the frame member 36b through the hole defined by the recesses 32a and 32b so as to securely adhere the assembled male connector 12 to the hybrid integrated circuit 10 and to satisfactorily fix the soldering portions between the connecting pins 24a and 24b and the corresponding connecting terminals 22g and 22h while perfectly shielding the interior of the hybrid integrated circuit 10. Thus, the portion between the male connector 12 and the frame member 36b is filled with the epoxy resin 38.

A portion between the frame member 36a and the side wall 18 is similarly filled with the epoxy resin 38 to protect the flexible circuit board 22f and to shield the interior of the hybrid integrated circuit 10 before the frame 20 is mounted.

Figure 9:
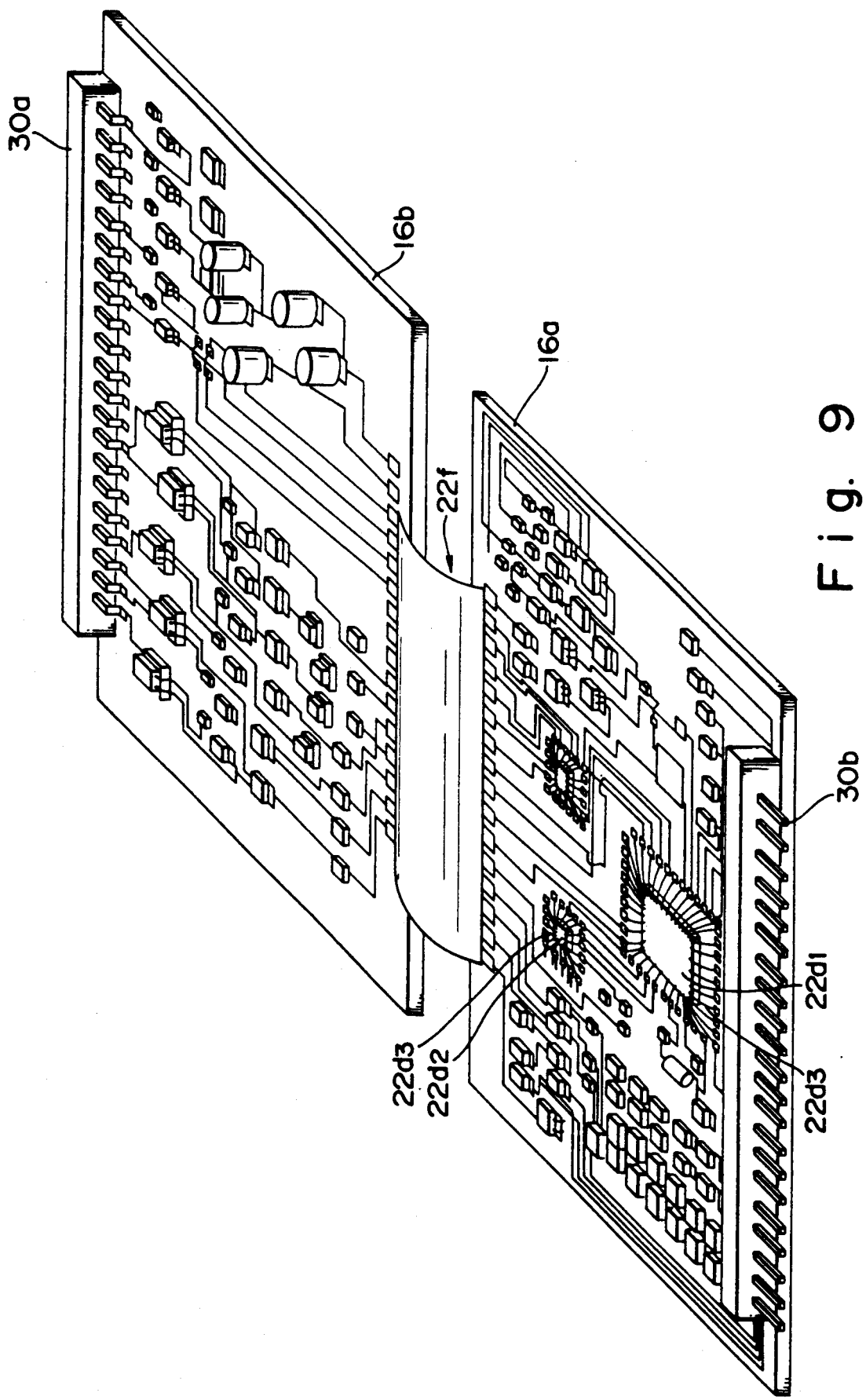
FIG. 9 is a schematic perspective view of an arrangement of circuit elements on a first circuit board.

As described above, the so-called logic circuit elements are connected to the lower first circuit board 16a, as described above. More specifically, as shown in FIG. 9, an IC chip $22d_1$ having functions equivalent to those of an IC package (e.g., MC6801 available from MOTOROLA Corp.) serving as a CPU which can selectively execute a function of an engine control unit and a diagnostic function is mounted, as a bare chip, on the first circuit board 16a, as shown in FIG. 9. In other words, the IC chip $22d_1$ is directly mounted on the first circuit board 16a via bonding wires $22d_3$. Note that the IC chip $22d_1$ is connected to a ROM (not shown) for storing a predetermined control program.

An IC chip $22d_2$ having functions equivalent to those of an IC package (e.g., $\mu$PD2764 available from NEC Corp.) in which various data necessary for the CPU $22d_1$ to execute a control sequence are written is directly mounted, as a nonvolatile programmable memory element, on the insulating layer 22b of the first circuit board 16a via the bonding wires $22d_3$ in the same manner as the IC chip $22d_1$. Note that a predetermined map, default values, constants for defining threshold values, and the like are set and stored in the memory element $22d_2$. In addition, various other circuit elements such as power transistors, gate circuit elements, voltage regulators, capacitors, resistors, diodes, and the like are mounted on the first circuit board 16a.

A switching mechanism 50 for selectively switching the function of the engine control unit and the diagnostic function in the CPU $22d_1$, in other words, for selectively switching and executing a logic processing content as the engine control unit and a logic processing content as the diagnostic function will be described below with reference to FIGS. 10 to 12.

As shown in FIG. 10, a judgment circuit 42 is mounted on the insulating layer 22b of the lower first circuit board 16a. An output terminal $X_{out}$ of the circuit 42 is connected to a switching terminal $Y_{in}$ of the CPU $22d_1$ via an output line $22c_1$ extending on the insulating layer 22b. When a "0"-level signal is input to the switching terminal $Y_{in}$, the CPU $22d_1$ determines a normal mode, and executes the function of the engine control unit as the first logic processing content. When a "1"-level signal is input to the switching terminal $Y_{in}$, the CPU determines a diagnostic mode, and executes the diagnostic function as the second logic processing content.

An input terminal $X_{in}$ of the judgment circuit 42 is electrically connected to the conductive circuit board body 22a of the first circuit board 16a via an input line $22c_2$. More specifically, a bonding through hole 44 is formed in a portion of the insulating layer 22b adjacent to the input line $22c_2$, and the conductive circuit board body 22a is exposed from the bottom surface of the through hole 44, as shown in FIG. 11. The input line $22c_2$ and the circuit board body 22a exposed from the bottom surface of the through hole 44 are electrically connected to each other through a bonding wire 46.

As shown in FIG. 12, a parallel circuit of a chip resistor $22d_4$ and a chip capacitor $22d_5$ is inserted between a ground line $22c_3$ connected to a ground terminal of the CPU $22d_1$ and the input line $22c_2$ The above-mentioned judgment circuit 42 outputs a "0"-level signal from its output terminal $X_{out}$ when no voltage is applied to the circuit board body 22a of the first circuit board 16a and a voltage of 0 V is input to the input terminal $X_{in}$ connected to the circuit board body 22a via the bonding wire 46 and the input line $22c_2$. On the other hand, the circuit 42 outputs a "1"-level signal from its output terminal $X_{out}$ when a voltage of 5 V is applied to the circuit board body 22a of the first circuit board 16a and a voltage of 5 V is also input to the input terminal $X_{in}$.

Since the switching mechanism 50 is arranged as described above, the normal mode is set in a normal operation state since no voltage is applied to the circuit board body 22a of the first circuit board 16a. As a result, the CPU $22d_1$ of the hybrid integrated circuit 10 serves as the engine control unit upon reception of the "0"-level signal output from the judgment circuit 42 which received a voltage of 0 V. On the other hand, in order to set the diagnostic mode when a vehicle is subjected to a maintenance in an auto repairshop like in, e.g., periodical inspection, a connecting terminal (not shown) is externally brought into contact with the circuit board body 22a of the first circuit board 16a, and a voltage of +5 V is applied to the circuit board body 22a via this connecting terminal, so that a "1"-level signal is output from the judgment circuit 42. Upon reception of the "1"-level signal, the CPU $22d_1$ of the hybrid integrated circuit 10 executes the diagnostic function in a switched state.

Figure 13:
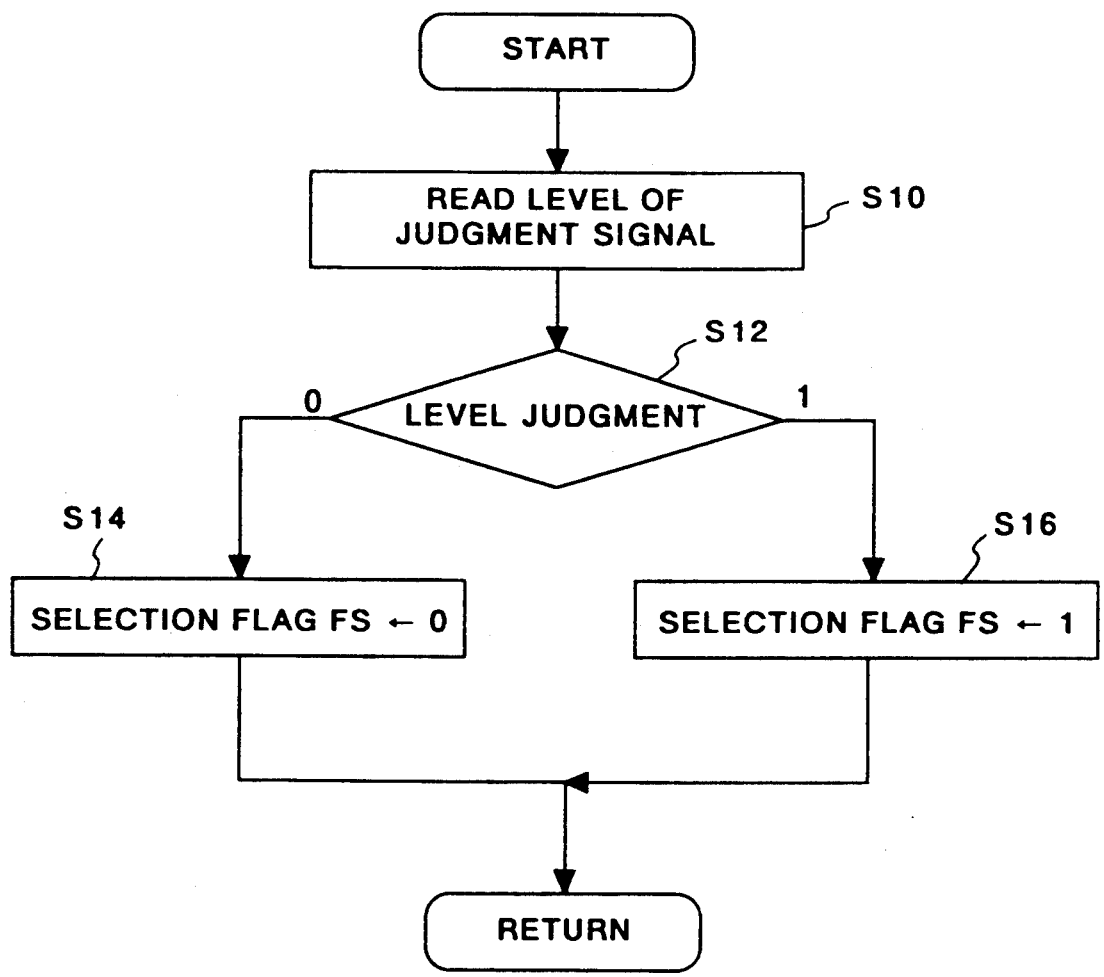
FIG. 13 is a flow chart showing a control sequence for discriminating two different logic processing modes and selecting one of these modes in a CPU.

More specifically, as shown in FIG. 13, the CPU $22d_1$ reads a level of the signal input to its switching terminal $Y_{in}$ in step S10, and then checks in step S12 if the read signal level is "0" or "1". If it is determined in step S12 that the level of the signal input to the switching terminal $Y_{in}$ is "0" level, the CPU sets "0" in a selection flag FS in step S14 to execute the function of the engine control unit. However, if it is determined in step S12 that the level of the signal is "1", the CPU sets "1" in the selection flag FS in step S16 to execute the diagnostic function. After step S14 or S16 is executed, this control sequence returns.

In a detailed switching operation, when the integrated circuit 10 is caused to execute the normal engine control function, the circuit board body 22a of the first circuit board 16a defining the outer surface of the case of the integrated circuit 10 is kept disconnected from any power source. In this manner, when no power source is connected to the circuit board body 22a of the first circuit board 16a, a voltage of 0 V is input to the input terminal $X_{in}$ of the judgment circuit 42. In this manner, a "0"-level signal is output from the output terminal $X_{out}$ of the judgment circuit 42, and the CPU $22d_1$ can execute the engine control operation, as described above.

When the integrated circuit 10 is caused to execute the diagnostic function, the circuit board body 22a of the first circuit board 16a is connected to a power source for outputting a voltage of 5 V through a connecting cord (not shown). In this manner, when the circuit board body 22a of the first circuit board 16a is connected to the power source, a voltage of 5 V is input to the input terminal $X_{in}$ of the judgment circuit 42. In this manner, a "1"-level signal is output from the output terminal $X_{out}$ of the judgment circuit 42, and the CPU $22d_1$ can execute the diagnostic control operation, as described above.

The CPU 22d repetitively executes the above-mentioned switching judgment sequence at predetermined time intervals, and switches the selection flag FS.

Since the engine control processing as the first logic processing content is known to those who are skilled in the art, a description thereof will be omitted.

Figure 14:
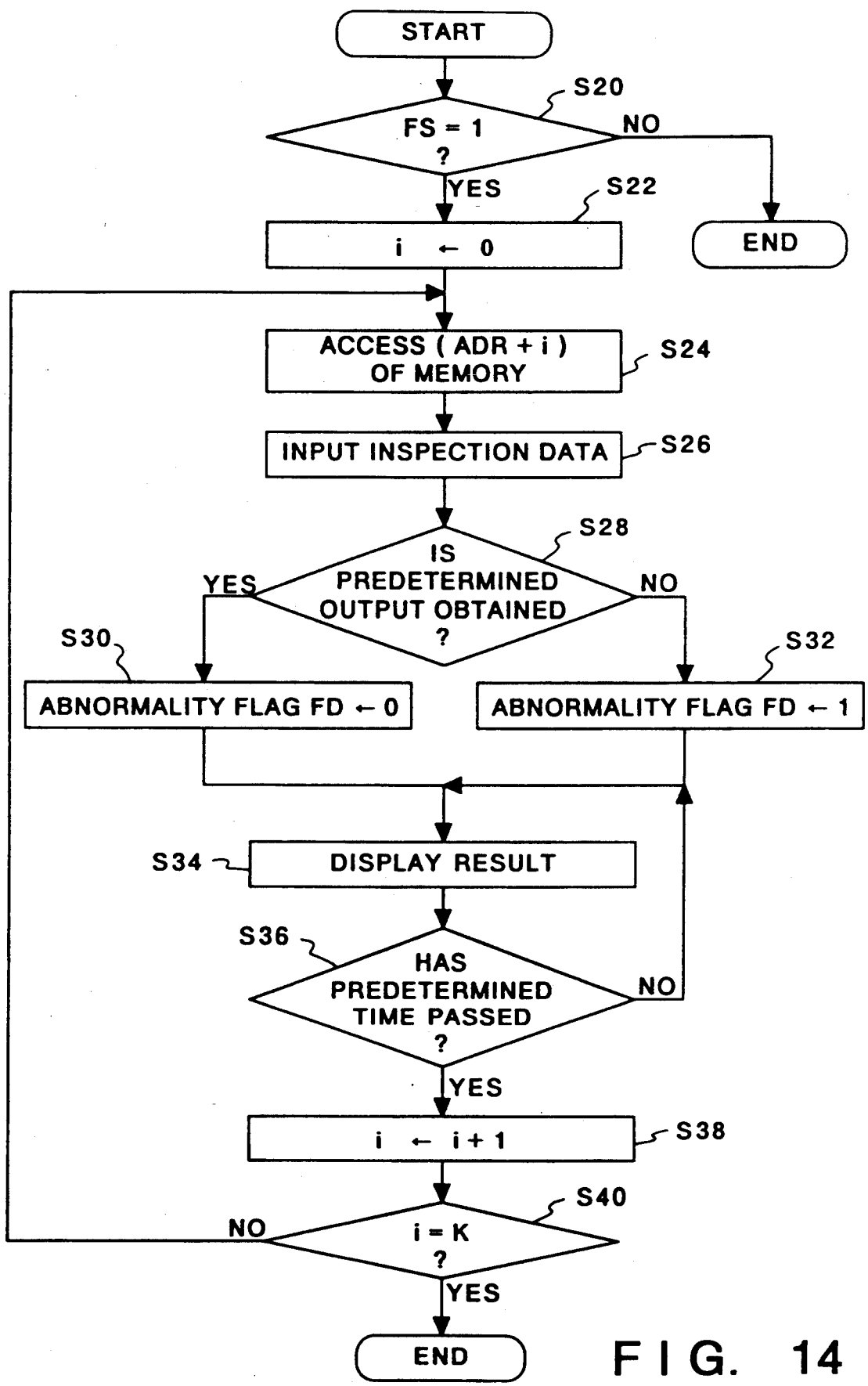
FIG. 14 is a flow chart showing a second logic processing content.

A control sequence of the diagnostic processing as the second logic processing content will be described below with reference to FIG. 14.

It is checked in step S20 if the selection flag FS is "1". If it is determined in step S20 that "1" is not set in the selection flag FS, this control sequence is immediately ended. However, if it is determined in step S20 that "1" is set in the selection flag FS, "0" is set in a variable i for designating an address of a memory in step S22. Thereafter, an ith address position (ADR+i) of the memory is accessed. Note that the relationship between addresses and data in the memory is set, as shown in FIG. 15. In FIG. 15, addresses of the memory correspond to a plurality of sensors, respectively.

In step S26, predetermined inspection data is input to the address of the memory accessed in step S24. It is then checked in step S28 if a predetermined output can be obtained. If it is determined in step S28 that the predetermined output can be obtained, "0" is set in an abnormality flag FD in step S30. The abnormality flag FD indicates a normal state when it is set to "0", and indicates an abnormal state when it is set to "1". On the other hand, if it is determined in step S28 that the predetermined output cannot be obtained, "1" is set in the abnormality flag FD in step S32. After step S30 or S32 is executed, an inspection result is displayed in step S34, and its display time is regulated to a predetermined time in step S36.

After the inspection result is displayed for the predetermined time, the variable i is incremented by one in step S38, and it is checked in step S40 if the variable i reaches K as a maximum address value of the memory. If NO in step S40, i.e., if it is determined that the variable i does not reach the maximum value K, the flow returns to step S24, and the above-mentioned control sequence is executed again. On the other hand, if YES in step S40, i.e., if it is determined that the variable i reaches the maximum value K, the control sequence is ended.

When the diagnostic control sequence as the second logic processing is executed in this manner, all the addresses of the memory can be reliably inspected since the variable i is sequentially incremented from 0 to the maximum value K.

As described in detail above, in the hybrid integrated circuit 10 of this embodiment, the CPU $22d_1$ comprises the logic processing unit having two different logic processing contents, i.e., the first logic processing content for executing the function of the engine control unit in the normal mode, and the second logic processing content for executing the diagnostic function in the diagnostic mode. When a potential input through the input line $22c_2$ is 0 V on the basis of an application potential to the conductive circuit board body 22a constituting the first circuit board 16a on which the CPU $22d_1$ is mounted as a bare chip, the judgment circuit 42 determines the normal mode, and outputs the "0"-level signal to the switching terminal of the CPU $22d_1$ via the output line $22c_1$ so as to execute to the first logic processing content as the function of the engine control unit. When a potential input through the input line $22c_2$ is +5 V, the judgment circuit 42 outputs the "1"-level signal so as to execute the second logic processing content for executing the diagnostic function. In this manner, the judgment circuit 42 discriminates the two different logic processing modes, and the CPU $22d_1$ can selectively execute the logic processing operation corresponding to the discriminated logic processing mode from the two different logic processing contents.

In the above embodiment, the hybrid integrated circuit 10 to which the male connector 12 is fixed defines its upper and lower surfaces by the pair of circuit boards 16a and 16b. As a result, according to this embodiment, the number of parts of the hybrid integrated circuit 10 is reduced, and a compact structure and low cost can be attained.

In this embodiment, each of the circuit boards 16a and 16b comprises the conductive aluminum circuit board body 22a, the insulating layer 22b adhered on the circuit board body 22a, and the conductive layer 22c adhered on the insulating layer 22b to have a predetermined circuit pattern. As a result, heat generated from the various circuit elements 22d can be dissipated by utilizing the aluminum circuit board body 22a as a heat sink. Therefore, no additional heat radiation member is required, and the integrated circuit can be greatly reduced in size.

Furthermore, in this embodiment, since the upper and lower surfaces of the case are defined by the pair of circuit boards 16a and 16b each having the aluminum circuit board body 22a, these circuit boards 16a and 16b can be utilized as electromagnetic shield members. As a result, an internal space of the hybrid integrated circuit 10 on this case can be essentially electromagnetically shielded, and the circuit elements 22d can be prevented from an electromagnetic wave trouble.

The present invention is not limited to the arrangement of the above embodiment, and various changes and modifications may be made within the spirit and scope of the invention.

In the above embodiment, the CPU $22d_1$ of the hybrid integrated circuit 10 is set to execute the function of the engine control unit as the first logic processing content, and to execute the diagnostic function as the second logic processing content. The logic processing contents of the present invention are not limited those contents, but may be logic processing contents which are set to serve as functional components of a vehicle speed controller, a four-wheel steering controller, an automatic transmission controller, and the like. The number of contents is not limited to two but may be three or more.

In the above embodiment, when the normal mode is set, no voltage is applied to the circuit board body 22a constituting the first circuit board 16a. When the diagnostic mode is set, a voltage of +5 V is applied through the connecting terminal (not shown). However, the present invention is not limited to this arrangement. For example, a selection switch may be connected in advance to the circuit board body 22a, and an application voltage to the circuit board body 22a may be selected via the selection switch.

As described in detail above, the integrated circuit having the metal substrate according to the present invention comprises circuit boards in each of which a conductive layer having a desired pattern is formed on a metal substrate via an insulating layer, a circuit element comprising a logic processing unit mounted on the insulating layer and having at least two different logic processing contents, and a judgment means for discriminating at least two different logic processing modes on the basis of a potential of the metal substrate. The circuit element selectively switches and executes a logic processing operation corresponding to the logic processing mode discriminated by the judgment means.

Therefore, according to the present invention, there can be provided an integrated circuit having a metal substrate, which can selectively switch and execute at least two different logic processing contents without complicating its arrangement.

As many apparently widely different embodiments of the present invention can be made without departing from the spirit and scope thereof, it is to be understood that the invention is not limited to the specific embodiments thereof except as defined in the appended claims.

What is claimed is:

1. An integrated circuit which comprises:
   a circuit board in which a conductive layer having a desired pattern is formed on a metal substrate through an insulating layer;
   a circuit element mounted on said insulating layer, connected to the predetermined conductive layer, and comprising a logic processing unit having at least two different logic processing contents; and
   judgment means, formed on said insulating layer, for discriminating on the basis of a potential of said metal substrate which one of at least two different logic processing modes is set,
   wherein said circuit element selectively switches and executes a logic processing operation corresponding to the logic processing mode discriminated by said judgment means from the at least two different logic processing contents.

2. The integrated circuit according to claim 1, wherein
   said insulating layer has, in a portion thereof, an opening for exposing a surface of said metal substrate therefrom, and
   said judgment means detects a potential of said metal substrate from the exposed surface portion of said metal substrate through the opening.

3. The integrated circuit according to claim 2, wherein said conductive layer comprises an output line for electrically connecting an output terminal of said judgment means and an input terminal of said circuit element and outputting a judgment signal from said judgment means to said circuit element, an input line connected to an input terminal of said judgment means, and a ground line for defining a ground level.

4. The integrated circuit according to claim 3, which further comprises:
   a bonding wire for electrically connecting said input line and the surface of said metal substrate exposed from the opening.

5. The integrated circuit according to claim 3, which further comprises:
   a resistor element and a capacitor element, both of which connect said ground line and said input line in parallel with each other.

6. The integrated circuit according to claim 1, wherein
   said circuit element comprises a first logic processing content for executing normal logic processing, and a second logic processing content for executing diagnostic processing.

7. The integrated circuit according to claim 6, wherein
   when said judgment means detects that the potential of said metal substrate is low, said judgment means outputs a judgment signal to said circuit element to execute the first logic processing content, and when said judgment means detects that the potential of said metal substrate is high, said judgment means outputs the judgment signal to said circuit element to execute the second logic processing content.

8. The integrated circuit according to claim 6, wherein
   when said judgment means detects that the potential of said metal substrate is substantially zero, said judgment means outputs a judgment signal to said circuit element to execute the first logic processing content, and when said judgment means detects that the potential of said metal substrate is higher than zero, said judgment means outputs the judgment signal to said circuit element to execute the second logic processing content.

9. The integrated circuit according to claim 2, wherein
   said metal substrate changes a potential thereof upon application of a voltage from a surface opposite to the surface exposed to the opening.

* * * * *